United States Patent
Outram (10) Patent No.: US 10,110,142 B2
(45) Date of Patent: Oct. 23, 2018

(54) BALANCING AND/OR DISCHARGE RESISTOR ARRANGEMENTS

(71) Applicant: ALSTOM TECHNOLOGY LTD, Baden (CH)

(72) Inventor: John Lewis Outram, Stone Staffordshire (GB)

(73) Assignee: ALSTOM TECHNOLOGY LTD (CH)

( * ) Notice: Subject to any disclaimer, the term of this patent is extended or adjusted under 35 U.S.C. 154(b) by 0 days.

(21) Appl. No.: 15/121,448

(22) PCT Filed: Feb. 25, 2015

(86) PCT No.: PCT/EP2015/053934
§ 371 (c)(1),
(2) Date: Aug. 25, 2016

(87) PCT Pub. No.: WO2015/128377
PCT Pub. Date: Sep. 3, 2015

(65) Prior Publication Data
US 2016/0373022 A1      Dec. 22, 2016

(30) Foreign Application Priority Data
Feb. 26, 2014   (EP) ..................... 14156721

(51) Int. Cl.
*H02M 1/36*         (2007.01)
*H02M 7/06*         (2006.01)
(Continued)

(52) U.S. Cl.
CPC .............. *H02M 7/06* (2013.01); *H02M 1/32* (2013.01); *H02M 1/36* (2013.01); *H02M 7/217* (2013.01);
(Continued)

(58) Field of Classification Search
CPC ...... H05K 5/0256; H03K 17/102; H02M 1/32; H02M 1/088; H02M 2007/4835;
(Continued)

(56) References Cited

U.S. PATENT DOCUMENTS

2008/0198630 A1   8/2008   Hiller
2011/0031939 A1*  2/2011   Funaba .................. B60K 6/445
                                                        320/166
(Continued)

FOREIGN PATENT DOCUMENTS

| EP | 2284982 | 2/2011 |
| EP | 2 608 382 A1 | 6/2013 |
| JP | H08212948 | 8/1996 |
| JP | 2000152664 | 5/2000 |
| WO | 2012/004027 A1 | 1/2012 |
| WO | 2014/005634 A1 | 1/2014 |

OTHER PUBLICATIONS

International Search Report in corresponding matter, Application No. PCT/EP2015/053934, dated Jul. 28, 2015.
(Continued)

*Primary Examiner* — Timothy J Dole
*Assistant Examiner* — Bryan R Perez
(74) *Attorney, Agent, or Firm* — Parks IP Law LLC (57) ABSTRACT

Circuits comprising at least one energy storage device, a resistor and switch arranged in series with the resistor are described. The energy storage device is arranged in parallel with the series connection of the switch and the resistor, and the switch is arranged to selectively switch the resistor into a parallel connection to the energy storage device. In some examples, the switch comprises a series connection of semiconductor switching elements. In some examples, the circuit may comprise a sub-module for use in a multilevel modular converter.

20 Claims, 8 Drawing Sheets

(51) Int. Cl.
  *H03K 17/10* (2006.01)
  *H02M 7/217* (2006.01)
  *H05K 5/02* (2006.01)
  *H02M 1/32* (2007.01)
  *H02M 7/483* (2007.01)
  *H02M 1/088* (2006.01)

(52) U.S. Cl.
  CPC ......... *H03K 17/102* (2013.01); *H05K 5/0256* (2013.01); *H02M 1/088* (2013.01); *H02M 2001/322* (2013.01); *H02M 2007/4835* (2013.01)

(58) Field of Classification Search
  CPC .... H02M 2001/322; H02M 7/42; H02M 7/48; H02M 7/487; H02M 7/493; H02M 7/501; H02M 7/4826; H02M 7/49; H02M 7/4807; H02M 7/537; H02M 7/5387
  See application file for complete search history.

(56) References Cited

U.S. PATENT DOCUMENTS

2011/0298282 A1* 12/2011 Leppanen ............ H02J 7/0016
  307/32
2013/0057332 A1  3/2013 Aggeler et al.

OTHER PUBLICATIONS

English Abstract of JPH08212948.
English Abstract of JP2000152664.
Biela, J., et al., "Balancing Circuit for a 5kV/50ns Pulsed Power Switch Based on SiC-JFET Super Cascode," IEEE Transactions on Plasma Science, vol. 40, Issue 10, pp. 2554-2560 (Oct. 2012).
"Depletion Mode MOSFET," IXYS Corporation, pp. 1-5 (2011).
Office Action issued in connection with corresponding EP Application No. 14156721.4 dated Feb. 6, 2018.
First Office Action and Search issued in connection with corresponding CN Application No. 201580010917.2 dated Mar. 21, 2018.

* cited by examiner

BALANCING AND/OR DISCHARGE RESISTOR ARRANGEMENTS

This invention relates to balancing and/or discharge resistor arrangements, in some examples but not exclusively for use in converters such as voltage source converters.

In circuits containing energy storage devices such as capacitors, there is often a desire to discharge these energy storage devices to allow access to the circuit for maintenance and the like. This can be achieved by providing one or more discharge resistors (also known as bleed resistors), usually in parallel with an energy storage device. The higher the resistance, the slower the energy storage device will discharge. However, if a low resistance is chosen, this can lead to losses in the resistor during normal use of the apparatus. It is therefore usual to select a resistance which is a compromise between such losses and speed of discharge.

Although this is a concern with all manner of circuits, including domestic appliances and the like, the implications of failing to discharge energy storage devices become ever more serious as the energy stored therein increases.

In the environment of a converter, for example a voltage source converter, which may operate in a medium or high voltage environment, the need to ensure that energy storage devices have successfully discharged before the circuit is accessed can become acute.

EP2608382 describes a converter for use in electric cars. The converter circuit comprises sub-modules, each including an energy storage device in the form of a capacitor and a discharge circuit which includes a discharge resistor and a discharging switch. In the event of fault, such as a voltage change outside a defined range across the capacitor, a discharge signal is used to close the switch, allowing the capacitor to discharge. This has the advantage that the resistor is usually outside the circuit, so the losses during use need not be taken into account and the resistor can be chosen for energy dissipation only.

In relation to higher voltage converters, there is a developing interest in IGBT based Voltage Source Converters (VSCs). These are highly controllable converters which can accurately produce desirable voltage forms with low harmonic components and allow full independent control of active and reactive power, and thus are able to meet the reactive power needs of a network, for example as a Static Compensator (STATCOM). Due to these advantages, VSCs are generally replacing thyristor based Current Source Converters (CSCs) as the technology of choice. A particular class of VSC is the Modular Multilevel Converter (MMC), which has a scalable topology that can be designed to operate at high voltages. MMCs can provide excellent harmonic performance and these advantages, combined with relative ease of timing control, have made MMCs the subject of much ongoing research and development.

Many VSC designs, including MMCs, have a number of capacitors arranged in series. Under most conditions, these capacitors should be balanced in the sense that they should hold equal charge. Indeed, so called voltage sharing, or voltage balancing, is important in various apparatus where a string of series connected capacitors is provided. This is often achieved though providing resistors (often known as balancing resistors) to stabilise voltage sharing in a capacitor string, a balancing resistor being arranged across each capacitor. However, as with the inclusion in a circuit of a discharge resistor, such a balancing resistor carries the cost of higher operational losses.

According to a first aspect of the invention, there is provided a sub-module for use in a multilevel modular converter, the sub-module comprising at least one energy storage device, a sub-module resistor and switch arranged in series with the sub-module resistor, wherein the energy storage device is arranged in parallel with the series connection of the switch and the sub-module resistor, and the switch is arranged to selectively switch the sub-module resistor into a parallel connection with the energy storage device, wherein the switch comprises a series connection of semiconductor switching elements.

Selectively switching in a sub-module resistor (which may comprise a single resistive element or multiple such elements which together provide a resistance) means the sub-module resistor may be switched out the sub-module circuit in some operative states. This in turn means that the resistive value thereof may be selected just to perform its function when switched into the circuit, rather than as a compromise bearing in mind losses which may otherwise occur during operative states where it is not required. Providing a series connection of switching elements means that fast acting semiconductor switches, such as JFETs and MOSFETs may be used, even though these are not generally available with sufficiently high voltage ratings be used in association with the energy storage device (typically one or more capacitors) of a sub-module of a multilevel modular converter (MMC), as such converters are often arranged to operate in a high voltage environment.

As will be appreciated, a sub-module for a MMC would generally also incorporate one or more switching devices, for example power electronic switches such as IGBTs or the like, for example arranged in a half-bridge or full-bridge arrangement to provide a converter sub-module.

Preferably, the sub-module resistor is chosen so as to draw current which exceeds (preferably substantially exceeds) that drawn by (typically constant-power load) sub-module control circuitry, which may be advantageous in stabilising voltage sharing between sub-modules.

In one embodiment, the series connection of switching elements comprises semiconductor switches inter-connected with passive components arranged such that a single input switching signal causes all the switching elements in the series to operate in a substantially overlapping timeframe. This allows for load sharing between the switching elements.

The series of switching elements may be arranged such that a change in switching state of a switching element in the series provides a switching signal for a subsequent switching element in the series. This is a convenient way for one switch to switch the next in the series. In one example, a potential divider may be provided between switching elements, and arranged to divide the voltage at the output of the preceding switch such that a proportion of the voltage at the output of the preceding switch provides a switching signal to the subsequent switch.

As will be appreciated by the skilled person, a potential divider typically comprises elements (typically resistors, capacitors or inductors), which act to step down a supplied voltage to a proportion of the supplied voltage, the proportion depending on the ratio of the elements.

In one particular embodiment of the present invention, a switch may be switched off by a gate signal, which results in a voltage being seen across a first switching element. This voltage may be divided by the potential divider such that a proportion thereof provides a gate signal to the next switching element in the series. This therefore allows a relatively large voltage difference to provide a relatively small gate voltage, as might typically be required for a semiconductor switch. Therefore, in such examples, the proportion of the voltage which provides the switching signal may preferably be small compared to the output voltage.

In one example, the potential divider comprises a first and a second resistance, and further comprises, in association with each of the resistances, a capacitance. The capacitances may be chosen to dynamically balance the gate capacitance of the switching element, and to dominate over the gate capacitance, reducing sensitivity to parameter variation respectively. The ratio of the two capacitances may be approximately equal to the reciprocal of the ratio of the two resistances.

In another example, a potential divider may be provided across the entire switch to divide the total voltage, usually equally, between the switching elements. Such a potential divider may comprise a series string of voltage dividing components (e.g. a series string of resistors which provide static voltage sharing and/or a string of capacitors, to provide dynamic voltage sharing), and may have a number of 'tappings' arranged between voltage dividing elements to supply an input to a switching element. For example, each switching element may be associated with one or more gate-biasing component (e.g. a voltage dividing component of the potential divider), wherein the gate biasing components are arranged to divide the voltage across the switch.

In one embodiment of the present invention, a switch may be switched off by a gate signal, which results in a voltage being seen across a first switching element. This voltage will act to switch off the next switching element and so on up the chain. Once all switching elements are supporting voltage across them, the potential divider will govern the share of the total voltage that each switching element in the series supports. This therefore allows a voltage larger than the rating of any individual switching element to be supported by the chain of switching elements.

As noted above, a potential divider may comprise or more resistances, which may be provided by one or more resistors. In another example, the potential divider may comprise one or a series of zener diodes, which may be provided in conjunction with one or more capacitor and/or resistor to provide the potential divider.

The first switching element may be switched directly, for example under the control of a controller of the sub-module. This could start a process of switching of the series of the switching elements, each triggered by the change in switching state of the preceding switch as outlined above. However, it would also be possible to provide such a direct switching signal to some or all of the switching elements (although preferably such signals would be timed to ensure that no one switching element bears the full load of the discharging energy storage device at any one time).

It could be that a controller is provided for each sub-module, and/or that common controllers are used for more than one sub-module. In one example, a common controller could be used for all sub-modules. In a further example, a sub-module controller may be in communication with converter control circuitry.

The switch may comprise a normally on switch, for example made up of normally on switching elements. This provides a failsafe, in that the resistor will be switched into the circuit in the event that a switching signal is lost (which could be deliberate or could be indicative perhaps of a wider shutdown of the converter), and is actively controlled to be out of the circuit in other modes of operation.

In one example, at least one switching element comprises a device which can turn on and/or off gradually (known as 'pinching' a current flowing therethrough). Such devices include field-effect transistors (FETs) such as junction gate field-effect transistors (JFETs). Therefore, if arranged such that the switching of a switching element may be triggered by a change in the switching state of a preceding switching element, the next switch in a series can be triggered before the change in switching state of the preceding switch is complete. This in turn means that no one switching element need bear the full load of the energy storage devices singly, and this can be achieved without precise control of multiple switching signals to multiple switching elements. A depletion mode JFET provides a 'normally on' switch, as is described in some examples herein. A suitable alternative is a metal-oxide-semiconductor field-effect transistor (MOSFET), in particular a depletion mode MOSFET if a normally on switch is required. However, the switching elements need not be all of the same type. In one particular example, the lowermost switch may be an enhancement mode MOSFET, with the rest of the series being provided with depletion mode JFETs or MOSFETs. This could provide a normally off switch.

According a second aspect of the invention there is provided a multilevel modular converter comprising a plurality of sub-modules according to the first aspect of the invention, and at least one controller, wherein the or each controller is arranged to selectively operate the switch of a sub-module to switch the resistor into a parallel connection with the energy storage device on at least one of:

(i) shutdown of the converter;
(ii) blocking of at least one sub-module in at least part of the converter; or
(iii) detection of voltage imbalance in the sub-modules.

Switching in a resistor on shutdown allows the resistor to act as a discharge resistor. In a state where the converter is blocked, such switching allows the sub-module resistor to assist with passively balancing the voltages across the sub-modules.

In further examples, such balancing could be carried out actively, for example by monitoring for voltage imbalance in the sub-modules, and selectively switching given resistors in to the sub-modules to counteract an imbalance. In some embodiments, voltage imbalance monitoring to detect a voltage imbalance capable of causing operation of the switch (i.e. option (iii) above) may be carried out in the event of states (i) or (ii) being detected (and, in some examples, not in other operative states).

In some embodiments, the converter may be an AC/DC converter. As will be familiar to the skilled person, such a converter can generally be thought of as comprising a plurality of valves, each valve relating to a phase of an AC voltage and a pole of the DC voltage, and, in the case of an MMC, each valve comprising a series connection of sub-modules. State (ii) may comprise blocking of a valve of such a converter.

According to a further aspect of the invention, there is provided a method of balancing voltages in a circuit comprising a series connection of capacitors, the method comprising providing at least one series connection comprising a resistor and a switch, and arranging at least one capacitor of the series connection of capacitors in parallel with a series connection of a switch and a resistor, and the method comprises selectively switching at least one resistor into or out of the circuit in order to balance the voltage across the series connection of capacitors.

Such active switching allows the resistor(s) to be out of the circuit in some use states, and therefore allows selection of a resistor which is optimised for balancing rather than selected with consideration to losses in other use states. The capacitor may be a single capacitive element or may be multiple such elements which are arranged to collectively supply a capacitance. The switch may comprise a series connection of switching elements, and may for example have any of the features of the switch described in relation to the first aspect of the invention. In some examples, a plurality, or each, of the capacitors of the series connection of capacitors may have a series connection of a switch and a resistor arranged in parallel thereto. The method may comprise controlling the switches to switch collectively or individually.

The method may comprise switching a resistor into the circuit when an associated capacitor exceeds a first threshold voltage and/or switching it out of the circuit when the capacitor voltage falls below a second voltage threshold. This will therefore provide voltage control as part of an active balancing method. The first and second threshold may be the same or different.

In such examples, preferably, the resistor(s) is/are chosen so as to draw current which exceeds (preferably substantially) that drawn by any other load connected across the associated capacitor. This is because such loads typically have constant power characteristics whereby the current will increase with a decrease in voltage and can thereby destabilise sharing in a series string of capacitors.

The capacitors may be energy storage devices within sub-modules of a modular converter, for example sub-modules as described in the first aspect of the invention, in which example the resistor may be a sub-module resistor. The method may also be applied to the MMC of the second aspect of the invention, in particular, for example, when such the sub-modules thereof are in a blocked state.

Teaching in relation to one aspect of the invention may be applied to any other aspect. The invention also comprises methods of use and/or control of apparatus as described in the first and second aspects of the invention.

Embodiments of the inventions will now be described by way of example only with reference to the following drawings, of which.

Figure 1A:
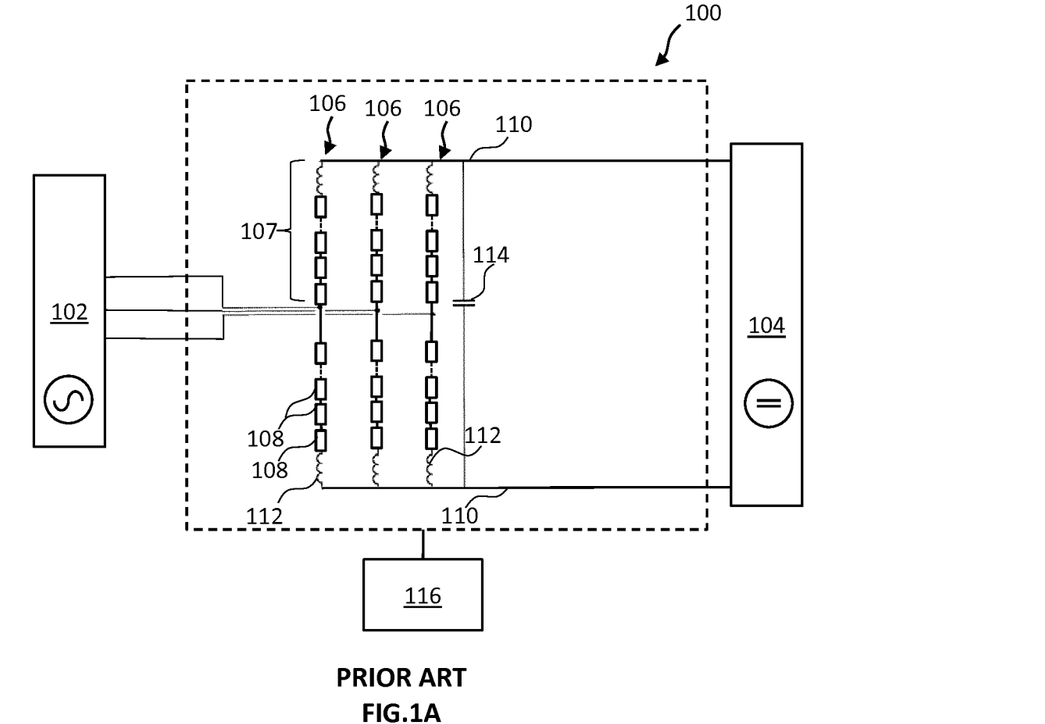
FIG. 1A is a schematic drawing of prior art multilevel converter.

Shown in FIG. 1A is a multilevel converter 100 arranged between an AC network 102 and a DC network 104. The multilevel converter 100 includes respective phase legs 106 (collectively forming a bridge) of series-connected converter sub-modules 108 (only some of which are labelled for the sake of clarity), arranged between DC poles 110. The sub-modules 108 are further described in relation to FIG. 1B below. Each leg 106 is made up of two valves 107 (only one of which is labelled for clarity). Therefore, as will also be familiar to the skilled person, such a converter 100 may be described as comprising six valves 107. The valves 107 comprise the series connection of sub-modules 108 between the AC connection to a leg 106 and a DC pole 110.

A valve reactor 112 (only two are labelled to avoid complicating the Figure) is also provided in each converter valve 107 to limit transient current flow between converter legs 106 and thereby enable the connection and operation of the converter legs 106. Also provided is a DC link capacitor 114, which operates to smooth the DC voltage. The converter 100 is under the control of converter control circuitry 116, which controls switching and monitoring functions. A 'broken line' notation is used in the legs 106 to illustrate that there may be fewer or more sub-modules 108 provided than are illustrated.

As will be appreciated by the skilled person, a sub-module 108 in this context is one of a number of such modules which are used to synthesis a voltage form in the converter 100 through selective switching of switches therein. This is discussed in greater detail below.

Figure 1B:
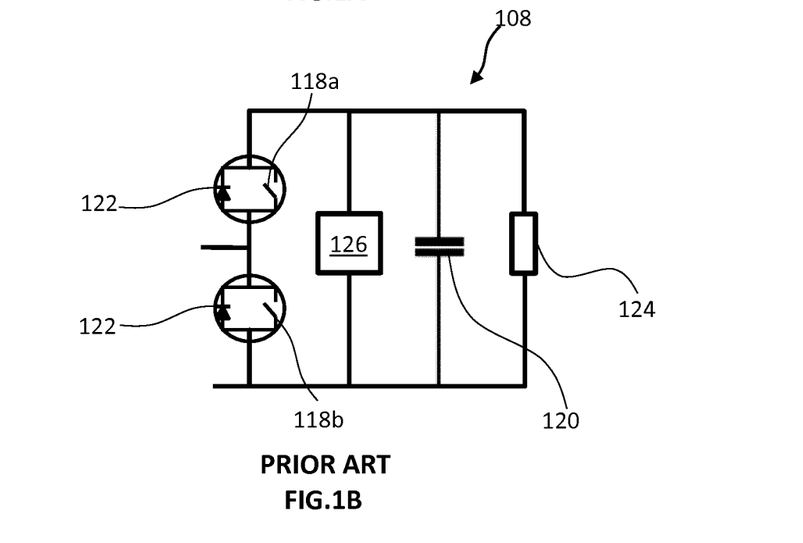
FIG. 1B shows a sub-module of the multilevel converter of FIG. 1A.

As shown in FIG. 1B, in this example, each converter sub-module 108 comprises a pair of switches in the form of series-connected IGBTs 118 connected in parallel with a capacitor 120, each associated with a unidirectional current device, in this case a diode 122, arranged in parallel with the IGBT switch 118. A first IGBT 118a is arranged between the terminals in series with the capacitor 120 and a second IGBT 118b is arranged to bypass the capacitor 120 when on. The capacitor 120 of each sub-module 110 is configured to have a sufficiently high capacitive value in order to constrain the voltage variation at the capacitor terminals. The capacitor 120 is associated with a bleed resistance 124 to allow it to discharge. A sub-module controller 126 is also provided and is arranged to switch the IGBTs 118a, b. The sub-module controller 126 is arranged to implement autonomous protection strategies and responds to instructions from converter control circuitry 116. In known converter designs, communication between sub-module controller 126 and converter control circuitry 116 utilises fibre optics.

The functioning of such a converter 100 will be familiar to the skilled person. Briefly, however, each sub-module 108 may be controlled to assume one of three switching states. In normal use, the capacitor 120 is either inserted into the circuit or bypassed. More specifically, the capacitor 120 is inserted into the circuit when the first IGBT 118a is on and the second IGBT 118b is off, and it is bypassed when the first IGBT 118a is off and the second IGBT 118b is on. There is also a blocked state, in which both the IGBTs 118 are off, and the current can only flow though the diodes 122 of the IGBTs 118. As used in an MMC, a blocked sub-module 108 will generally be arranged such that the capacitor 120 may charge, for example from a remaining connection to the AC and/or DC network, but not discharge. The blocked state may be employed during faults, on start up, shut down and/or when the converter 100 is in standby. The blocked state may be applied to all the sub-modules 108 in a valve 107 at the same time.

By controlling the IGBTs 118 in the sub-modules 108, voltage forms can be accurately synthesised.

As will be appreciated by the skilled person, the arrangement of FIG. 1B is known as a half-bridge arrangement, and provides a 2-quadrant unipolar module that can provide zero or positive voltage and can conduct current in two directions. Although herein, a half-bridge sub-module design is described, this is purely by way of example and other sub-module designs are possible, such as a full bridge arrangement, in which sub-modules comprise two pairs of switching elements (usually IGBTs) and an energy storage device (usually in the form of a capacitor). The pairs of switching elements are connected in parallel with the capacitor. This defines a 4-quadrant bipolar module that can provide negative, zero or positive voltage and can conduct current in two directions. Full bridge sub-modules give certain advantages, such as improved fault handing (in particular, improved DC fault handling), but require more switching components and have higher operational losses. As the skilled person will appreciate, other sub-module designs are being developed, including multiple level sub-modules (for example as described in WO2014/005634, WO2012/04027 and US2008/0198630, which are incorporated herein to the fullest extent allowable). Indeed, a converter may be a hybrid, containing more than one type of sub-module 108. The principles set out herein could be applied to any sub-module design as appropriate.

Further, the skilled person will be aware of alternative MMC designs, and the arrangement shown in FIG. 1 is purely by way of an example of one such design. For example, the components, and/or the connections there between, may be configurable.

Figure 2:
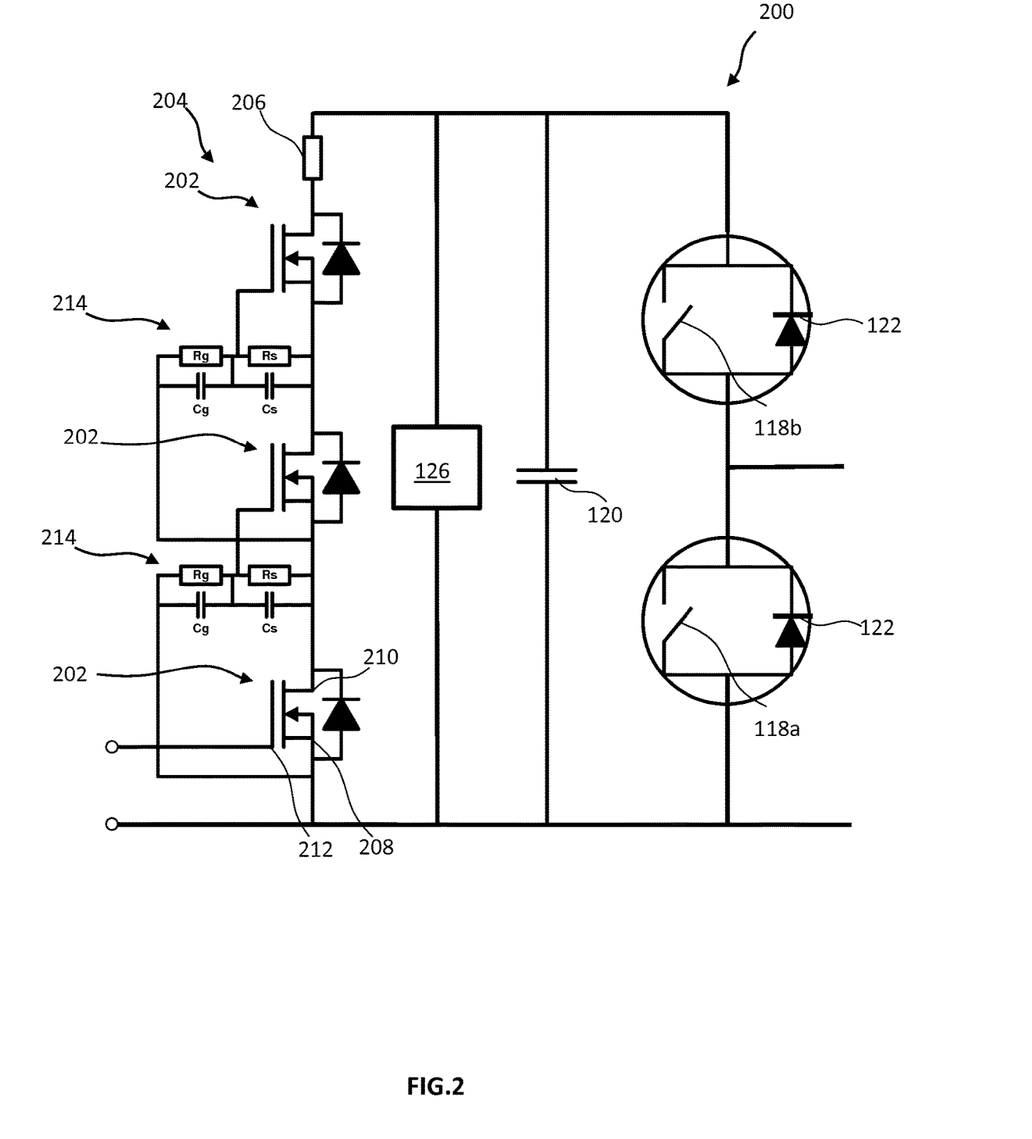
FIG. 2 shows a sub-module for a multilevel converter according to one embodiment of the present invention.

FIG. 2 shows a sub-module according to an embodiment of the present invention, termed a 'switched resistor' sub-module 200 herein, which in this example is arranged to form a sub-module 200 of an MMC having the structure of shown in FIG. 1A. Features in common with the sub-module 108 of FIGS. 1A and 1B are given like numbers. In particular, the switched resistor sub-module 200 comprises a pair of series-connected switches, in this case IGBTs 118a, 118b, connected in parallel with a capacitor 120, each associated with a unidirectional current device, in this case a diode 122.

In addition the switched resistor sub-module 200 comprises, in parallel to the capacitor 120 and the series connection of the IGBTs 118, a series connection of normally-on semiconductor switches (termed 'switching elements' 202 herein), which form a normally-on switch 204. The normally-on switch 204 is provided in series with a sub-module resistor 206 (which may be, in practice, a plurality of resistive elements such as a resistor network).

The sub-module resistor 206 is capable of providing a safety discharge path for the capacitor 120 (i.e. acting as a discharge, or bleed resistor), when the gate(s) of the switch 204 are not driven but driving the gate(s) to switch the normally on switch 204 off (and therefore removing the resistor 206 from the circuit) prevents loss during operative states where it is not required. In addition, and as described in greater detail below, the switch 204 can be controlled to manage voltage balance, in this example, in a converter valve 107.

This normally-on nature of the switch 204 is advantageous as it provides a 'fail safe', preserving the safety discharge path in the absence of a control signal, and meaning that incorporation of such a multi-component circuit does not reduce reliability in this regard. It also allows the energy stored in a sub-module/converter to be discharged, possibly right down to zero, without requiring any energy input (by contrast, a normally-off switch could require a separate energy source to keep it on as the energy stored approached zero voltage).

A further advantage may be seen in a so-called 'black start' of a converter whose topology otherwise does not provide a charging path to each capacitor 120 until that capacitor has reached a sufficient voltage to energise associated switching components. In such embodiments, the switch 204 could be 'on' to provide such a path.

In this example, all of the switching elements 202 are depletion-mode SiC JFETs, although other JFETs could be used, or else the switching element 202 could comprise depletion-mode MOSFETs (for example Si MOSFETs). In addition, while a circuit of n-channel devices is described herein, an inverted version of p-channel devices is a possible configuration.

The switching elements 202 are connected in series. Use of a semiconductor devices such as depletion-mode FETs in a sub-module of an MMC would not generally be made as such switches are not typically available with adequate voltage rating. However, by arranging the switching elements 202 in series and further arranging the rest of the circuitry to ensure that no one switching element 202 bears the full load of the sub-module 202, as detailed below, such devices can be used in the manner described herein.

In this example, the normally on switch 204 is controllable from the gate of the lowest device only, such that the switch 204 can change state on the application (or removal) of a single signal.

As will be familiar to the skilled person, an n-channel JFET is a semiconductor which conducts current between terminals, which are termed the 'source' 208 and 'drain' 210) under the control of a bias voltage applied to a gate terminal, commonly referred to as a gate 212. These terminals are labelled on the lowermost switching element 202 only to avoid over complicating the Figures.

Consider a starting point when there is no drive to the gate 212 of the lowermost switching element 202 (the gate voltage, or $V_{gs}$ is 0): it is a depletion-mode device and therefore on. Because this switching element is supporting no volts, the next switching element 202 also has a $V_{gs}$ of 0 and is on, so is also on, and so on, up the chain. The switch 204 is therefore on.

If the gate 212 of the lowermost switching element 202 is driven towards its negative threshold, it starts to turn off and its drain-source voltage ($V_{ds}$) rises. It will be noted that there is a potential divider 214 arranged across the lowermost switching element 202 so as to deliver a proportion of its $V_{ds}$ as $V_{gs}$ into the switching element 202 above (and more generally, such a potential divider could be provided to couple each switching element 202 in a chain to the one below).

Each potential divider 214 comprises a gate resistor $R_g$ and a source resistor $R_s$, which supply a proportion of the drain-source voltage to the gate terminal of the next switching element 202 in the series as a switching signal. Also provided are a gate capacitor $C_g$ and a source capacitor $C_s$. In this example, $C_g$ and $C_s$ are chosen to have roughly a reciprocal ratio to $R_g$ and $R_s$ (as will be appreciated by the skilled person, in practice it is likely that some fine tuning will be required to achieve optimal values). As a point of good practice, $C_s$ may be chosen to dominate over the gate capacitance of the next switching element 202 of the series, so that manufacturing variations in the switching element gate capacitance have negligible effect on the circuit performance. In use, the gate capacitor $C_g$ and source capacitor $C_s$ serve to dynamically balance the voltage sharing of the switching elements 202 during switching transients, whereas the resistors $R_g$ and $R_s$ provide static sharing.

Each potential divider 214 is arranged such that, when $V_{ds}$ of a lower switching element 202 reaches a predetermined value, the gate voltage $V_{gs}$ of the next switching element 202 reaches its turn-off threshold and so on up the chain.

Figure 3:
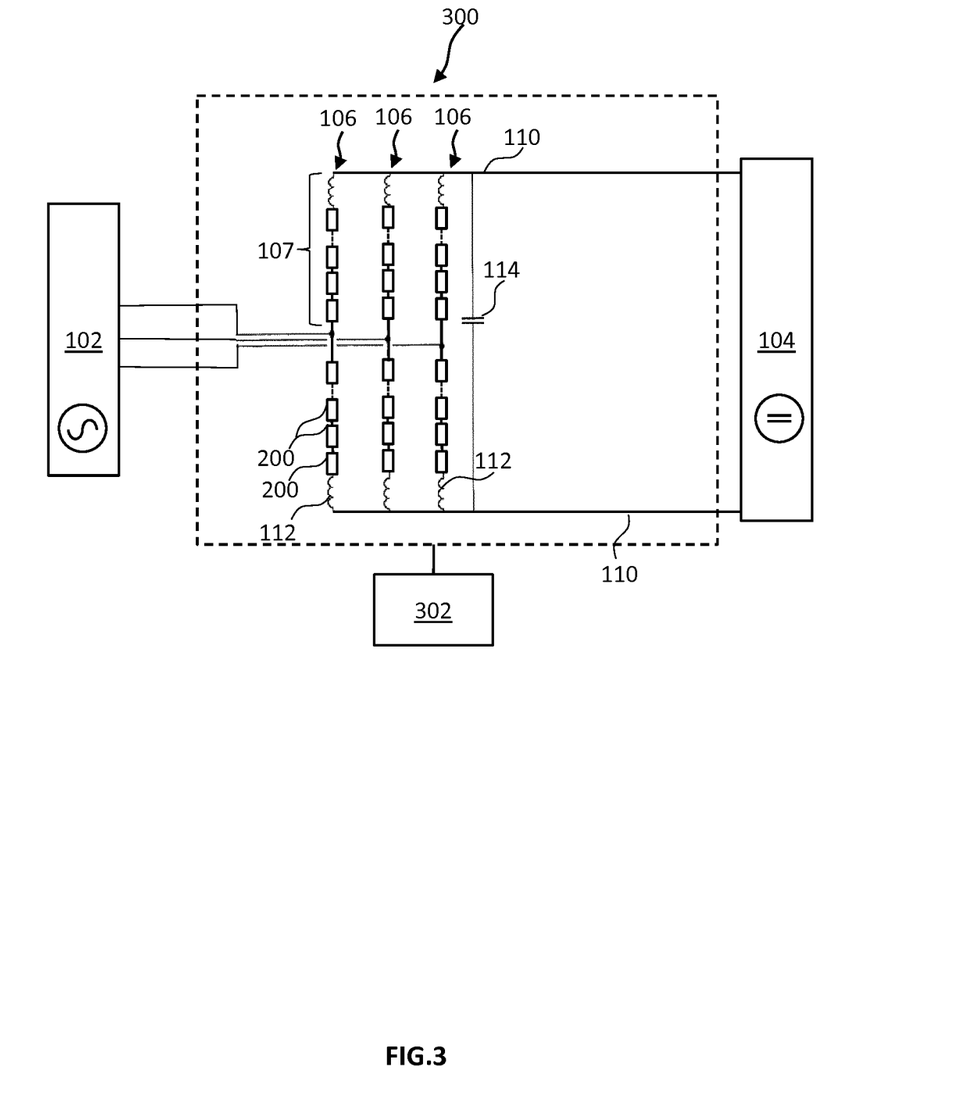
FIG. 3 shows a multilevel converter according to one embodiment of the present invention.

FIG. 3 shows a converter 300 similar to that shown in FIG. 1 (and in which parts in common with FIG. 1 are labelled with like reference numerals). However, the sub-modules 108 shown FIG. 1 have been replaced by the switched resistor sub-modules 200 of FIG. 2, and the sub-module controllers 126 respond to instructions from the converter control circuitry 302. The converter control circuitry 302 is also arranged to provide a signal to sub-module controller 126, which in turn provides a signal to the gate 212 of the lowermost switching element 202 in the event that the sub-module resistor 206 is desired, to improve efficiency, to be switched out of the circuit (i.e. in operative states where it is not required for balancing or discharge etc). The arrangement is such that the sub module controller 126 draws less current than that of the discharge (sub-module) resistor 206. In addition, the converter control circuitry 302 may carry out monitoring functions, in particular monitoring the voltage across the sub-modules 200, to allow for active switching in balancing the sub-modules 200, as described in greater detail below.

In a particular example, the discharge resistor 206 is a 27 kΩ resistor and the potential divider 212 is set so that, when $V_{ds}$ of the lowermost switching element 202 has reached 700 V, $V_{gs}$ of the next switching element 202 has reached its turn-off threshold of −3 V and so on up the chain. The gate resistor is a 1 MΩ resistor, and the source resistor is a 4.3 kΩ resistor. The gate capacitor of this example is a 68 pF capacitor, and the source capacitor is a 10 nF capacitor. In this example, the switching elements 202 are rated at 1000 V.

Figure 4A:
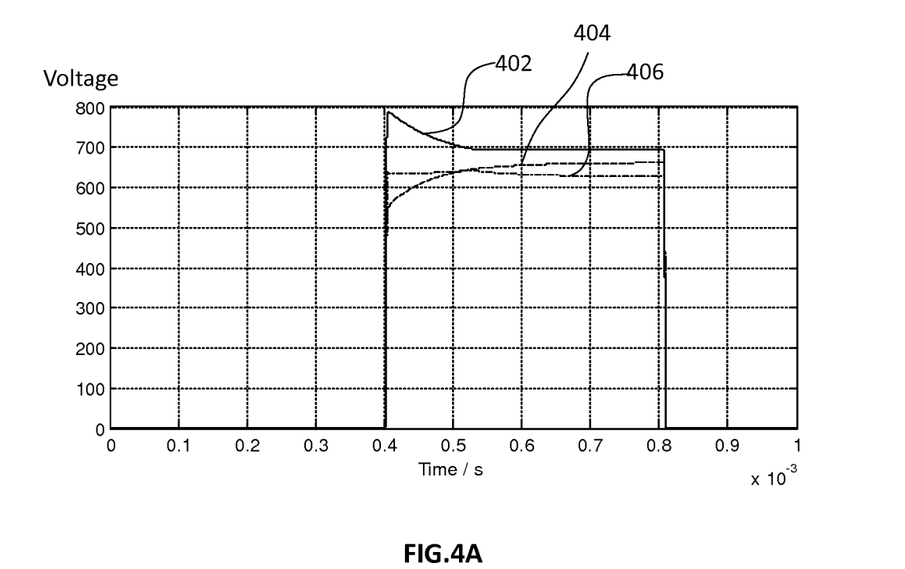
FIGS. 4A and 4B show voltages across switching elements in one example of the present invention.
Figure 4B:
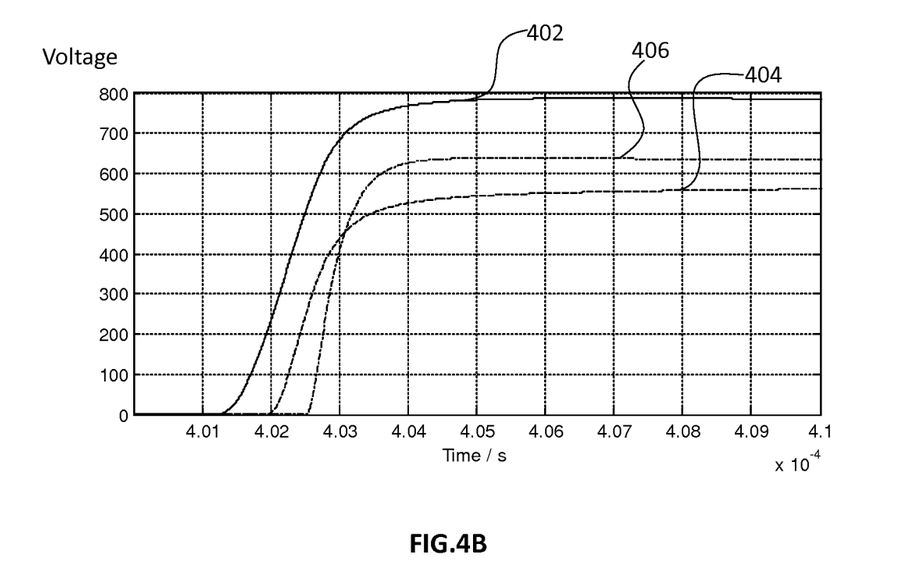
Figure 5A:
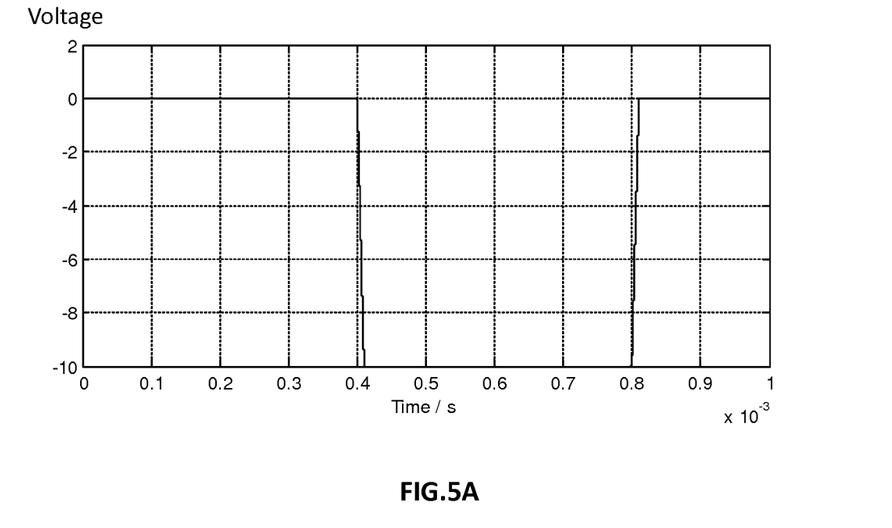
FIGS. 5A and 5B show a gate voltage at a switching element in the example of FIGS. 4A and 4B.
Figure 5B:
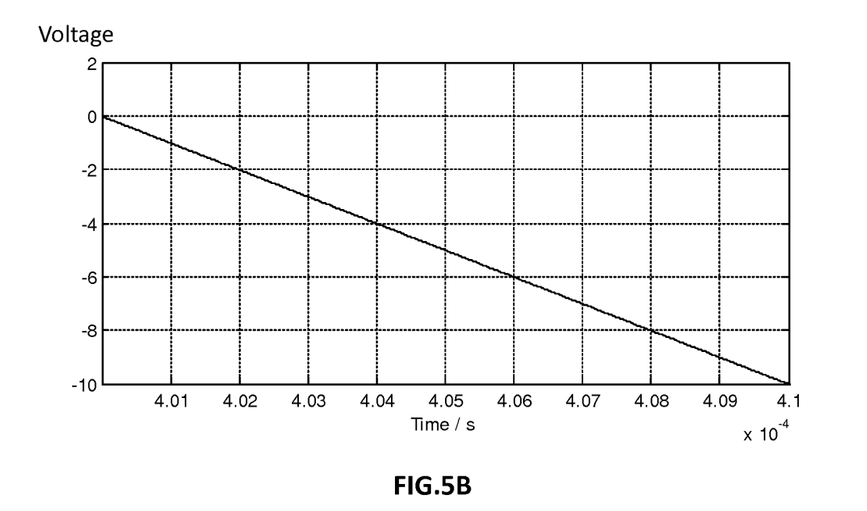

FIGS. 4 and 5 show the simulated response of a switch 204 in such a circuit.

FIGS. 4A and 4B show the increase in $V_{ds}$ of each of the switching elements 202, with the $V_{ds}$ of the lowermost switching element shown as a solid line 402, the $V_{ds}$ of the middle switch in dashed line 404 and the $V_{ds}$ of the uppermost switching element 202 shown as dot-dash line 406. FIG. 4B shows a portion of the data shown in FIG. 4A over a different, more detailed time frame. As can be seen, the switching elements 202 respond rapidly to a single input signal. It will also be appreciated that no one switching element 202 is subject to the full load (2000V) at any one time, which could result in overloading of that switching element 202 (which it will be recalled have a rating of 1000V in this example). Similar load sharing occurs as the switch 204 switches on.

FIGS. 5A and 5B show the gate voltage at the lowermost switching element 202. This is therefore the control input used to trigger switching of the three switching elements 202. As noted above, the JFETs of the switching elements 202 have a turn-off threshold of −3V, which is reached at $4.03*10^{-4}$ seconds (see FIG. 5B), by which time all of the switching elements are substantially off (see FIG. 4B). It will also be noted that the gate voltage is controlled to be −10V. Although in ideal circumstances this has no further impact on the switching state, as will be appreciated by the skilled person, it is a matter of good practice to drive the gate voltage beyond its threshold in case of noise, variations in switching threshold due to temperature, etc.

As noted above, in a first mode of operation, the switch 204 may be controlled such that it generally off during normal use of the apparatus, and then allowed to switch on on shut down of apparatus containing the switch 204 so that the resistor 206 can discharge the capacitor 120 and thus allow safe access to the circuitry for repair, maintenance and the like.

However, there are other modes of operation which could be advantageous, in particular to assist with balancing a series of capacitors arranged in a string. One example in the context of an MMC such as that shown in FIG. 3 is now described.

As will be familiar to the skilled person, if a valve 107, or indeed a converter 100 as a whole, is blocked (and as explained above), the capacitors 120 in the sub-modules 108 can charge via the diodes 122. However, these capacitors 120 will also be discharged by the sub-module controllers 126, which have with a predominantly constant-power demand. In such a situation (in which the capacitors in a valve 107 can be viewed a series connection of capacitors), it is desirable to balance the capacitors 120 (or at least the capacitors 120 in a given valve) such that the same charge is seen across each, and each draws equal current. However any imbalance due to manufacturing tolerance or the like can result in a particular sub-module 108 having a lower voltage, so drawing more current, which results in an uncontrolled feedback loop in which the energy imbalance tends to grow.

However, controllers such as, in this example, the sub-module controllers 126 or converter control circuitry 302 or combination thereof could be used to control the switched resistor sub-modules 200 in such a circuit. In particular, the switch 204 could be controlled to allow it to switch on (i.e. the switching elements 202 are controlled to be on), inserting the resistor 206 into the circuit, when the converter 300, a leg 106 or valve 107 thereof enters a blocked state. Further, if the circuit was arranged such that the current drawn by the resistor 206 dominates over that of the sub-module controller 126, then a situation is created in which a capacitor will draw more current when the voltage across it is higher, and a convergent feedback loop is provided.

In such an example, the resistor 206 could still be switched out of the circuit in normal operation, and therefore voltage sharing in the capacitor string by resistance across each capacitor can be carried out without the cost of operational losses due to the presence of a resistor 206.

In an alternative, or in addition, to such passive balancing, active balancing could be carried out when the converter 100 is in a blocked state. In such an example, the voltage across each capacitor 120 could be monitored (for example by one or more controllers such as the sub-module controllers 126 or converter control circuitry 302 or combination thereof) and the switch 204 operated as necessary to control the voltage. For example, the resistor 206 could be switched in when the voltage across a capacitor 120 exceeded a first threshold, and switched out when the voltage was below a threshold.

Although a particular example has been described in some detail herein, variations are possible. For example, in the potential divider 212, $R_g$ could be replaced by one or a series of zener diodes and the device could still function as described above. Further, the potential divider 212 (or some of the potential dividers 212) could be removed altogether, for example replaced with a direct switching signal to all or a subset of the switching elements 202.

Of course, while the above embodiment shows three switching elements, there could be two, four or more such switching elements.

The bottom JFET switching element 202 and potential divider 212 could be replaced with a low-voltage enhancement-mode MOSFET. If the switch was otherwise as outlined above, this MOSFET would only have to support the 3 V plus safety margin required to switch off the JFET switching element above it, making a normally off switch 204.

Figure 6:
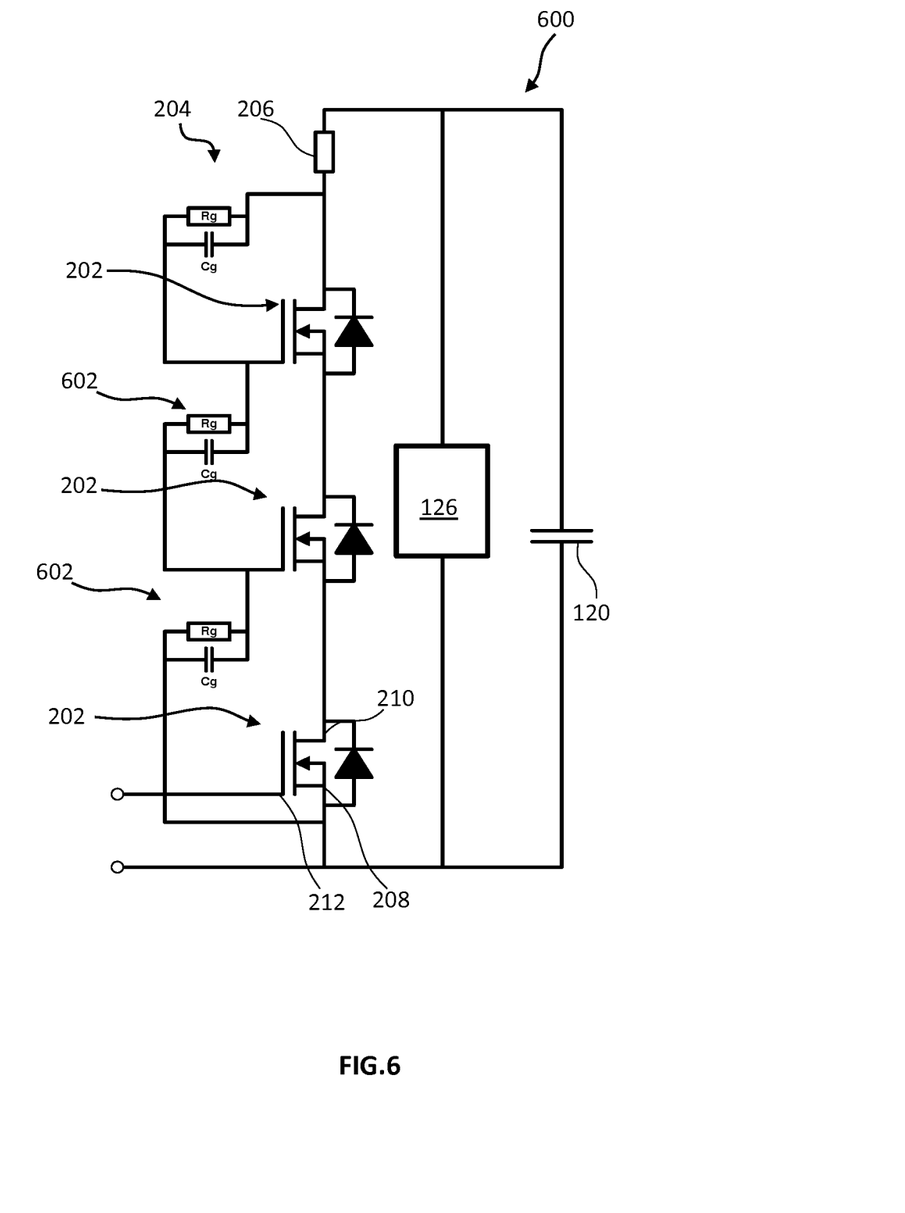
FIG. 6 shows a switchable resistor circuit according to one embodiment of the present invention.

A further embodiment of a switched resistor capacitor circuit 600 is shown in FIG. 6. This circuit could also form a part of a sub-module for use in a converter with the addition of IGBTs or other switching elements, for example as illustrated in relation to FIG. 2.

This embodiment has some features in common with that shown in FIG. 2 and like parts are labelled with like numbers. However, in this example, the switching elements 202 are switched by gate-biasing components 602, each comprising one resistor (gate resistor $R_g$) and one capacitor (gate capacitor $C_g$). The gate-biasing components 602 are connected in a single overall potential divider across the switch 204, rather than as individual potential dividers at each stage, as shown in FIG. 3.

Consider the starting point when there is no drive to the gate of the lowermost switching element 202, which in this example is again a depletion mode FET: it is a depletion-mode device and therefore on. Because the lowermost switching element 202 is supporting no volts, the FET above has a $V_{gs} \geq 0$, so is also on, and so on up the chain. If the gate of the lowermost switching element 202 is driven towards its negative threshold, it starts to turn off and its $V_{ds}$ rises, driving $V_{gs}$ of the lowermost switching element 202 above towards its negative threshold, and so on up the chain.

The potential divider comprising the gate resistors $R_g$ and the gate capacitors $C_g$ causes the switching elements 202 to share the total voltage approximately equally, both statically, due to the resistances and dynamically, due to the capacitances. For the reasons noted above, $C_g$ is chosen to dominate over the gate capacitance in the switching elements 202. Replacement of one, some or all gate resistors $R_g$ by one or more zener diode is possible. The IXTY1R6N100D2 provided by IXYS Corporation, is a possible FET for this application. An additional resistor in series with each FET gate may be required or desired to fine-tune dynamic performance.

It will of course be noted that this circuit comprises fewer components than the arrangement shown in FIG. 2, which can have advantages in terms of cost and/or reliability. In addition, it will be less sensitive to variation of the gate threshold voltage of the semiconductor devices.

Figure 7A:
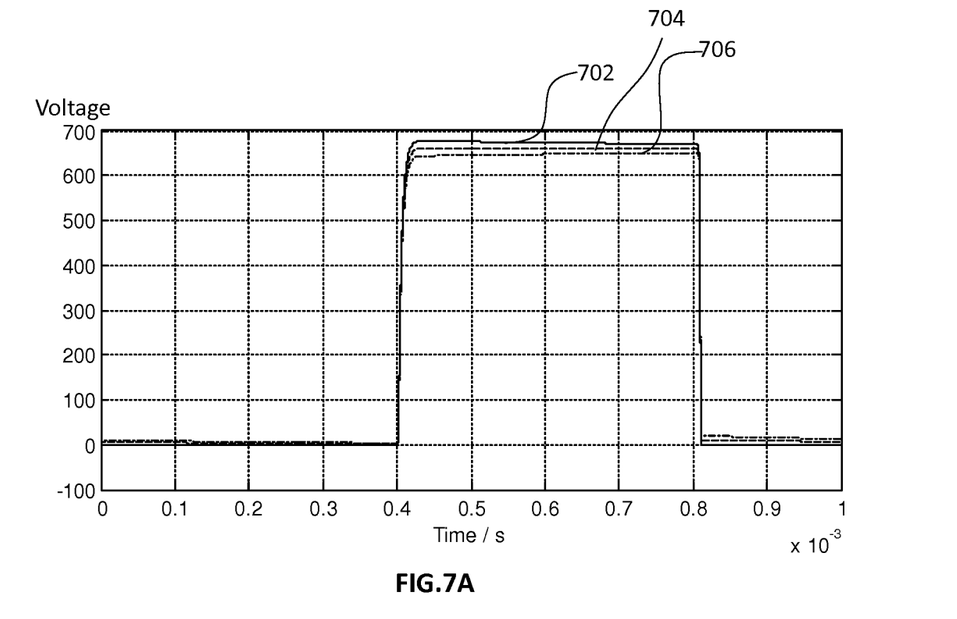
FIGS. 7A and 7B show voltages across switching elements in one example of the present invention.
Figure 7B:
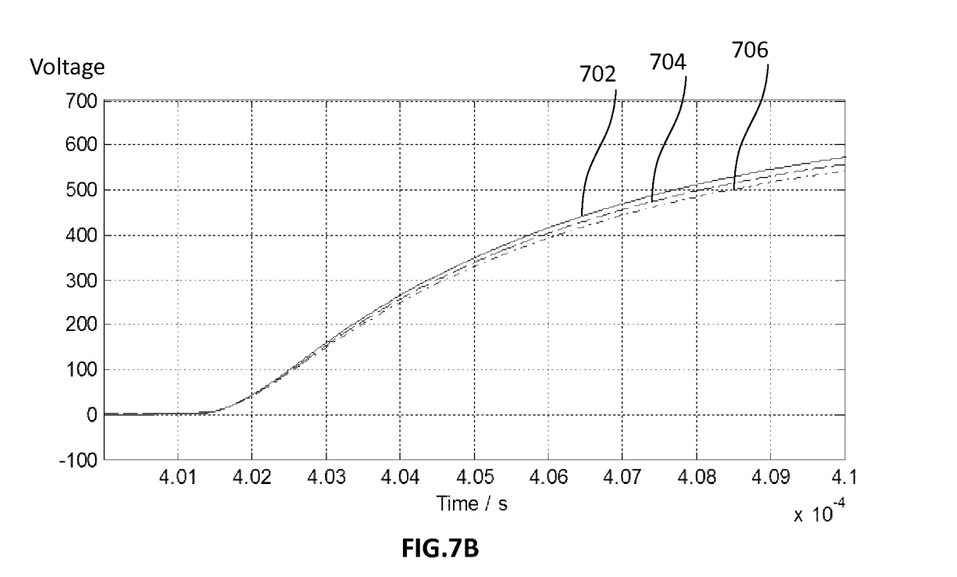
Figure 8A:
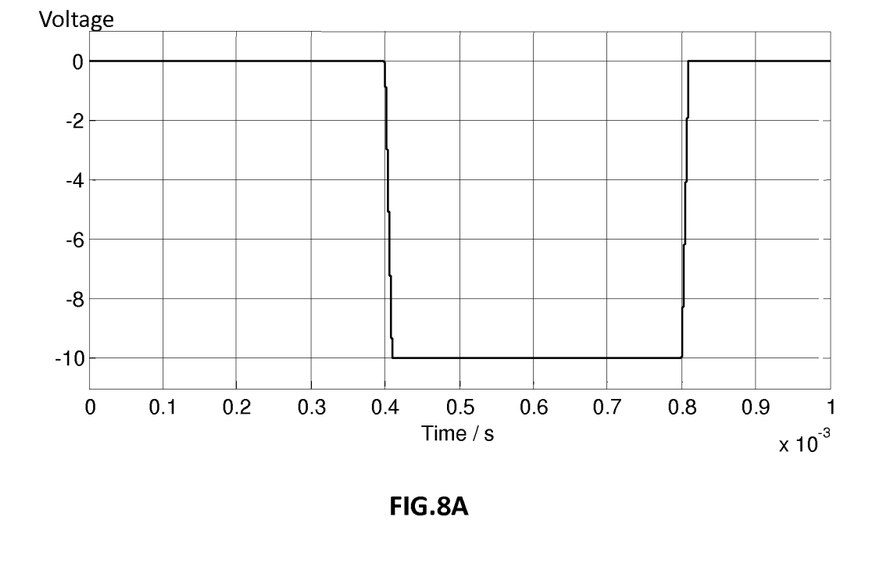
FIGS. 8A and 8B show a gate voltage at a switching element in the example of FIGS. 7A and 7B.
Figure 8B:
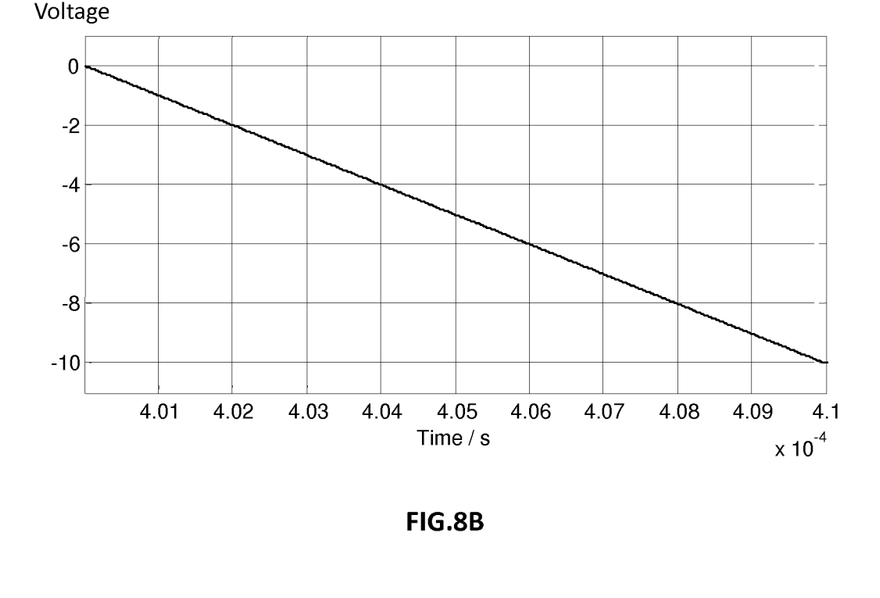

FIGS. 7 and 8 show the simulated response of a switch 204 in a simulated circuit in which the discharge resistor 206 is a 27 kΩ resistor, the gate resistors are 1MΩ resistors, and the gate capacitors of this example are 470 pF capacitors.

FIGS. 7A and 7B show the increase in $V_{ds}$ of each of the switching elements 202, with the $V_{ds}$ of the lowermost switching element shown as solid line 702, the $V_{ds}$ of the middle switch in dashed line 704 and the $V_{ds}$ of the uppermost switching element 202 shown as dot-dash line 706. FIG. 7B shows a portion of the data shown in FIG. 7A over a different, more detailed time frame. As can be seen, the switching elements 202 share the voltage well.

FIGS. 8A and 8B show the gate voltage at the lowermost switching element 202. This is therefore the control input used to trigger switching of the switching elements 202. As noted above, the FETs of the switching elements have a turn-off threshold of −3V, which is reached at $4.03*10^{-4}$ seconds (see FIG. 8B), by which time all of the switching elements are substantially off (see FIG. 7B), the voltage rate-of-rise being dictated by the charging rate of the capacitance in the circuit. It will also be noted that the gate voltage is controlled to be −10V. Although in ideal circumstances this has no further impact on the switching state, as will be appreciated by the skilled person, it is a matter of good practice to drive the gate voltage beyond its threshold in case of noise, variations in switching threshold due to temperature, and the like.

To briefly compare the arrangement of FIG. 2 with that shown in FIG. 6, and as will be appreciated by the skilled person, in FIG. 2, the action of each switching element 202 only depends on the voltage across the switching element 202 below it, such that the former protects the latter from exceeding its rating. If the total voltage is less than the sum of the voltage settings of all switching elements 202, then the upper switching element(s) 202 may carry little or no voltage. In FIG. 6, the action of the circuit is to share the total voltage among switching elements 202 regardless of its magnitude; to achieve this, the resistor chain which forms the potential divider must span the total voltage (i.e. there are resistors associated with each switching element 202 so the number of resistors Rg is equal to the number of switching elements 202, rather than individual potential dividers between each switching element 202, as is the case in the embodiment of FIG. 2).

In further exemplary variations on the embodiments described herein, the sub-module 200 could be provided with a full bridge (rather than half-bridge) design, or indeed any other design of sub-module as will be appreciated by the skilled person. In addition, the invention may be applied to converters with designs other than that shown. There may be fewer or more (possibly many more) switching elements 202 provided in series. Indeed, in particular with regard to balancing, the techniques described herein need not be carried out in a converter at all, but may be applied to any series connection of capacitors. Other variations within the scope of the invention will occur to the skilled person.

The invention claimed is:

1. A sub-module for use in a multilevel modular converter, the sub-module comprising:
   an energy storage device;
   a resistor; and
   a switch arranged in series with the resistor, the switch comprising a series of semiconductor switching elements and a potential divider, the series of semiconductor switching elements comprising a first switching element and a second switching element;
   the first switching element comprising a first gate terminal that is configured to control a state between a first source terminal and a first drain terminal;
   the second switching element comprising a second gate terminal that is configured to control a state between a second source terminal and a second drain terminal;
   the potential divider connecting an output of the first switching element to the second gate terminal of the second switching element such that a proportion of a drain-source voltage of the first switching element is configured to be provided as a gate voltage to the second gate terminal; and
   wherein the energy storage device is arranged in parallel with the switch and the resistor.

2. The sub-module of claim 1, wherein the sub-module is configured to be controlled by a controller, and the resistor draws a current which exceeds that drawn by the controller.

3. The sub-module of claim 1, wherein a change in a switching state of the first switching element provides a switching signal for the second switching element.

4. The sub-module of claim 3, wherein the potential divider is arranged to divide the drain-source voltage of the first switching element.

5. The sub-module of claim 4, wherein the potential divider comprises a first resistance and a second resistance.

6. The sub-module of claim 5, wherein the potential divider comprises a first capacitance and a second capacitance in association with the first and second resistances, respectively.

7. The sub-module of claim 6, wherein a ratio of the first and second capacitances is approximately equal to the reciprocal of the ratio of the first and second resistances.

8. The sub-module of claim 4, wherein the potential divider comprises a gate resistor and a source resistor.

9. The sub-module of claim 8, wherein the gate resistor and the source resistor are configured to supply a proportion of the drain-source voltage of the first switching element to the second gate terminal of the second switching element.

10. The sub-module of claim 8, wherein the potential divider further comprises a gate capacitor and a source capacitor.

11. The sub-module of claim 8, wherein the gate resistor and the source resistor are configured to balance the voltage sharing of the first switching element and the second switching element.

12. The sub-module of claim 8, wherein the gate resistor and the source resistor are configured to provide static sharing.

13. The sub-module of claim 1, wherein the potential divider is configured such that when the drain-source voltage of the first switching element reaches a pre-determined value, the gate voltage of the second switching element reaches a turn-off threshold.

14. The sub-module of claim 1, wherein the first gate terminal is controlled by a bias voltage from a controller.

15. The sub-module of claim 14, wherein the switch is on when the bias voltage is zero.

16. The sub-module of claim 1, wherein the switch is a normally on switch.

17. The sub-module of claim 1, wherein the potential divider couples the first switching element to the second switching element.

18. The sub-module of claim 1, wherein at least one of the series of semiconductor switching elements comprises a JFET or a MOSFET.

19. The sub-module of claim 1,
wherein the potential divider is a first potential divider and the switch further comprises a second potential divider;
the series of semiconductor switching elements further comprising a third switching element, the third switching element comprising a third gate terminal that is configured to control a state between a third source terminal and a third drain terminal; and
the second potential divider connecting an output of the second switching element to the third gate terminal of the third switching element such that a proportion of a drain-source voltage of the second switching element is configured to be provided as a gate voltage to the third gate terminal.

20. The sub-module of claim 19,
the first potential divider comprising a first gate resistor, a first source resistor, a first gate capacitor, and a first source capacitor;
the second potential divider comprising a second gate resistor, a second source resistor, a second gate capacitor, and a second source capacitor; and
wherein the first source capacitor has a greater capacitance than the second gate capacitor.

* * * * *